(12) United States Patent
Ishida et al.

(10) Patent No.: US 12,341,001 B2
(45) Date of Patent: Jun. 24, 2025

(54) CLEANING METHOD AND PLASMA PROCESSING APPARATUS

(71) Applicant: Tokyo Electron Limited, Tokyo (JP)

(72) Inventors: Wakako Ishida, Miyagi (JP); Yasunori Hatamura, Miyagi (JP); Eundo Bae, Hwaseong-si (KR); Kazuya Kato, Miyagi (JP); Inho Jang, Hwaseong-si (KR); Eisuke Numazawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 414 days.

(21) Appl. No.: 17/752,867

(22) Filed: May 25, 2022

(65) Prior Publication Data

US 2022/0384183 A1 Dec. 1, 2022

(30) Foreign Application Priority Data

May 25, 2021 (JP) .................................. 2021-087469

(51) Int. Cl.
| | | |
|---|---|---|
| *H01J 37/32* | (2006.01) | |
| *B08B 7/00* | (2006.01) | |
| *B08B 13/00* | (2006.01) | |
| *H01L 21/02* | (2006.01) | |
| *H01L 21/311* | (2006.01) | |

(52) U.S. Cl.
CPC ...... *H01L 21/02087* (2013.01); *B08B 7/0035* (2013.01); *B08B 13/00* (2013.01); *H01J 37/32449* (2013.01); *H01J 37/32834* (2013.01); *H01L 21/31116* (2013.01); *H01J 2237/20235* (2013.01); *H01J 2237/334* (2013.01)

(58) Field of Classification Search
None
See application file for complete search history.

(56) References Cited

U.S. PATENT DOCUMENTS 5,970,376 A * 10/1999 Chen ................. H01L 21/31116
134/1.1
2008/0194111 A1* 8/2008 Delgadino .......... H01L 21/0209
257/E21.483

FOREIGN PATENT DOCUMENTS

| JP | 2005-317782 A | 11/2005 |
| JP | 2005-317963 A | 11/2005 |
| JP | 2006-066855 A | 3/2006 |
| JP | 2007-220815 A | 8/2007 |
| JP | 2008-218997 A | 9/2008 |

* cited by examiner

*Primary Examiner* — Hsien Ming Lee
(74) *Attorney, Agent, or Firm* — XSENSUS LLP

(57) ABSTRACT

A substrate cleaning method includes: providing a substrate including a low-k layer containing silicon to a substrate support; etching the low-k layer by a plasma generated from a first gas; separating the etched substrate from the substrate support; and removing a reaction product attached to the substrate in the etching by a plasma generated from a second gas. The second gas includes a first carbon-containing gas represented by $C_xH_yF_z$ ($y \geq 0$, $x/z > 1/4$).

12 Claims, 8 Drawing Sheets

FIG. 6

| | Initial | CO2 | CO2+C4F8 |
|---|---|---|---|
| BARC Remain | 71.9nm | 67.4nm | 42.1nm |
| T/B CD | 87.5/53.1nm | 88.4/52.6nm | 92.9/57.1nm |
| Recess | 13.6nm | 15.8nm | 18.9nm |

CLEANING METHOD AND PLASMA PROCESSING APPARATUS

CROSS-REFERENCE TO RELATED APPLICATION

This application is based on and claims priority from Japanese Patent Application No. 2021-087469 filed on May 25, 2021 with the Japan Patent Office, the disclosure of which is incorporated herein in its entirety by reference.

TECHNICAL FIELD

The present disclosure relates to a cleaning method and a plasma processing apparatus.

BACKGROUND

Japanese Patent Laid-Open Publication No. 2005-317782 discloses that a traveling shock wave is generated in a chamber and the shock wave desorbs foreign substances attached to the back surface of a substrate.

SUMMARY

According to an aspect of the present disclosure, a substrate cleaning method includes: providing a substrate including a low-k layer containing silicon to a substrate support; etching the low-k layer by a plasma generated from a first gas; separating the etched substrate from the substrate support; and removing a reaction product attached to the substrate in the etching by a plasma generated from a second gas. The second gas includes a first carbon-containing gas represented by $C_xH_yF_z$ (y≥0, x/z>¼).

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6 is a view illustrating an example of a plasma processing result according to the embodiment.

DETAILED DESCRIPTION

Figure 1:
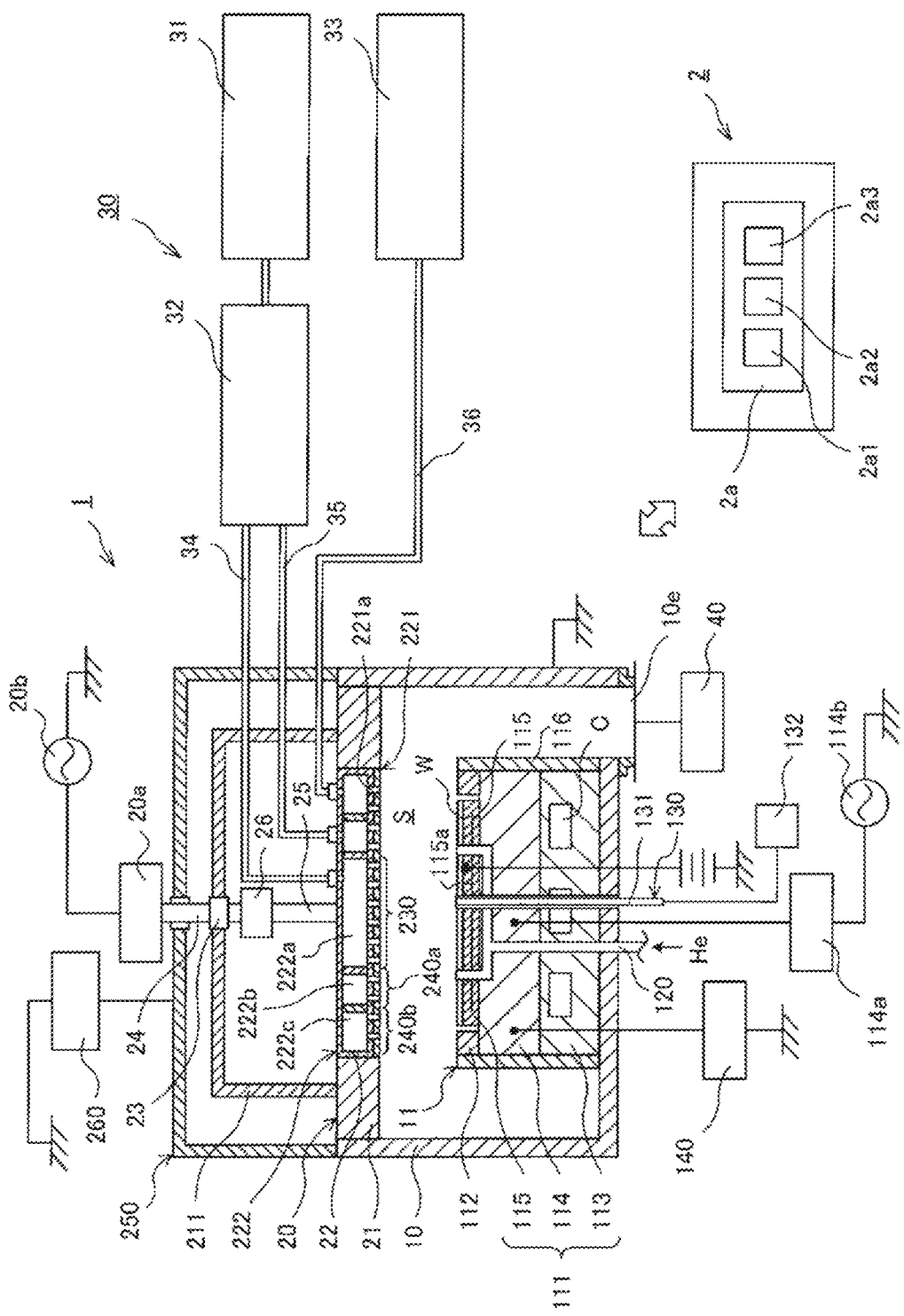
FIG. 1 is a vertical cross-sectional view illustrating the configuration of a plasma processing system according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

In the manufacturing process of a semiconductor device, an etching process is performed on an etching target film stacked on the surface of a semiconductor substrate (hereinafter, simply referred to as a "substrate") using a mask layer on which a pattern is formed as a mask. The etching process is generally performed by a plasma processing apparatus. Recently, a low-dielectric constant (low-k) material such as a SiOC film or a SiOCH film may be used as the etching target film.

In the plasma processing apparatus, there is a concern that, for example, a reaction product of a fluorocarbon (CF)-based polymer may be attached to a bevel portion or a back surface of the substrate to be etched during the above-mentioned etching process. The reaction product attached to the substrate may contaminate the inside of the apparatus by being desorbed during the process or transfer of the substrate, which may cause a problem in the apparatus or affect the processing result of the substrate.

As a method for removing the reaction product, for example, as disclosed in Japanese Patent Laid-Open Publication No. 2005-317782, a method of introducing a gas into a chamber to desorb the reaction product (gas cleaning) or a method of generating plasma inside the chamber to remove the reaction product (plasma cleaning) may be mentioned.

However, for example, in a case where the above-mentioned etching target film includes a low-k film, there is a concern that when the above-mentioned plasma cleaning is performed by a CF-based gas having a low carbon ratio represented by $C_xH_yF_z$ (x/z≤¼) (e.g., $CF_4$ gas), the low-k film may be deteriorated or damaged.

The technique according to the present disclosure has been made in view of the above-described circumstances, and reaction products attached to the bevel portion and the back surface of the substrate are appropriately removed by plasma etching. Hereinafter, with reference to the accompanying drawings, descriptions will be made on a plasma processing apparatus serving as a substrate processing apparatus according to the present embodiment and a plasma processing method including a cleaning method according to the present embodiment. Also, in the present specification and drawings, components having substantially the same functional configurations will be denoted by the same reference numerals, and the descriptions thereof will be omitted.

<Plasma Processing Apparatus>

FIG. 1 is a vertical cross-sectional view schematically illustrating an outline of the configuration of a plasma processing system. In the following description, the surface of a substrate W to be etched, that is, the surface on which the low-k film serving as the etching target film is formed is referred to as a "front surface" and the surface opposite to the front surface is referred to as a "back surface."

In an embodiment, the plasma processing system includes a parallel plate type plasma etching apparatus (hereinafter, referred to as a "plasma processing apparatus 1") and a control unit 2. The plasma processing apparatus 1 includes a substantially cylindrical processing container 10 for accommodating the substrate W, a substrate support 11 including a lower electrode (to be described later), an upper electrode 20, a gas supply unit 30, and an exhaust system 40.

The processing container 10 is made of, for example, an aluminum alloy and is electrically grounded. The inner wall surface of the processing container 10 is covered with an alumina film or an yttrium oxide film ($Y_2O_3$). Further, a carry-in/out port (not illustrated) for the substrate (wafer) W is provided on the side surface of the processing container 10, and the processing container 10 is connected to the outside of the plasma processing apparatus 1 via the carry-in/out port. The carry-in/out port is configured to be freely opened and closed by a gate valve (not illustrated).

A substrate support 11 on which the substrate W is disposed is provided inside the processing container 10. The substrate support 11 includes a main body 111 and a focus ring 112. The focus ring 112 is disposed to surround the periphery of an electrostatic chuck 115 (to be described later) of the main body 111.

In the embodiment, the main body 111 includes a support base 113, a susceptor 114, and an electrostatic chuck 115. The support base 113, the susceptor 114, and the electrostatic chuck 115 are stacked in this order from the bottom surface of the processing container 10.

The support base 113 has a substantially cylindrical shape and is provided substantially in the center of the bottom surface of the processing container 10 via an insulating plate (not illustrated). Further, a flow path C is formed inside the support base 113. A heat transfer medium from a chiller unit (not illustrated) is circulated and supplied to the flow path C. Thus, the temperature of the substrate W on the susceptor 114 (more specifically, on the electrostatic chuck 115) may be controlled to a desired temperature.

The susceptor 114 is supported on the support base 113. The susceptor 114 is made of a conductive member such as an aluminum alloy. The conductive member of the susceptor 114 functions as a lower electrode. A radio-frequency power supply 114b is electrically connected to the susceptor 114 via a matching unit 114a. The radio-frequency power supply 114b may output a first radio-frequency voltage in the range of, for example, 2 MHz to 20 MHz, for example, a frequency of 2 MHz. The matching unit 114a may match the internal impedance of the radio-frequency power supply 114b with the load impedance. The radio frequency from the radio-frequency power supply 114b may be pulsed.

The electrostatic chuck 115 is supported on the susceptor 114. An adsorption electrode 115a is provided inside the electrostatic chuck 115. The adsorption electrode 115a is connected to a DC power supply, an electrostatic force such as Coulomb force is generated by applying a voltage from the DC power supply to the adsorption electrode 115a, and the substrate W is adsorbed and held on the upper surface (e.g., a substrate mounting surface) of the electrostatic chuck 115 by the electrostatic force.

A cylindrical inner wall member 116 made of, for example, quartz is attached to the outer peripheral surfaces of the support base 113 and the susceptor 114.

Further, a gas supply pipe 120 and a lifter 130 are provided inside the main body 111 of the substrate support 11.

The gas supply pipe 120 is provided to penetrate the main body 111 in the thickness direction and is connected to a gas supply source (not illustrated). As a result, the gas supply pipe 120 may supply a heat transfer gas (e.g., a backside gas) such as He gas between the back surface of the substrate W and the electrostatic chuck 115, and control the substrate W adsorbed and held on the upper surface of the electrostatic chuck 115 to a desired temperature.

The lifter 130 includes a lifter pin 131 and an actuator 132. Examples of the actuator include an electric actuator, an air cylinder, and a motor. The lifter 130 raises and lowers the substrate W on the susceptor 114 (more specifically, on the electrostatic chuck 115), and adjusts the tip height of the lifter pin 131 such that the back surface position of the substrate W comes to a desired position.

The lifter pin 131 is a columnar member that moves up and down such that the upper end of the electrostatic chuck 115 protrude from and recedes into the substrate mounting surface, and is inserted into a through hole for a pin which is formed to penetrate the main body 111 of the substrate support 11 in the thickness direction. A plurality of lifter pins 131, for example, three or more lifter pins 131 are provided along the circumferential direction of the electrostatic chuck 115 (e.g., a substrate mounting surface) at intervals from each other. The lifter pins 131 are provided at equal intervals along the circumferential direction. The actuator 132 generates a driving force for raising and lowering the lifter pin 131, thereby raising and lowering the plurality of lifter pins 131.

The lifter 130 is configured to raise and lower the lifter pin 131 by the operation of the actuator 132 and freely move the lifter pin 131 among a delivery position (e.g., a position where the upper end protrudes from the substrate mounting surface), a standby position (e.g., a position where the upper end does not protrude from the substrate mounting surface), and a cleaning position (e.g., a position where the upper end protrudes from the substrate mounting surface and the position of the upper end is lower than the delivery position) of the substrate W. In other words, the lifter 130 is configured to freely move the substrate W held by the lifter pin 131 by the operation of the actuator 132 among a delivery position (e.g., a position where a delivery is made between substrate transfer robots), a processing position (e.g., a position to be mounted on the substrate mounting surface), and a cleaning position (e.g., a position where a reaction product attached to the substrate W is removed).

Further, a high-pass filter 140 is electrically connected to the susceptor 114 constituting the lower electrode. The high-pass filter 140 blocks a radio frequency from the radio-frequency power supply 114b connected to the lower electrode and passes a radio frequency from a radio-frequency power supply 20b connected to an upper electrode 20 (to be described later) to the ground.

The upper electrode 20 is provided above the substrate support 11 to face parallel to the susceptor 114 constituting the lower electrode. A plasma generation space S is formed between the susceptor 114 and the upper electrode 20.

The upper electrode 20 includes a ring-shaped outer upper electrode 21 and a disk-shaped inner upper electrode 22. A radio-frequency power supply 20b is electrically connected to the upper electrode 20 via a matching unit 20a. The radio-frequency power supply 20b may output a second radio-frequency voltage having a frequency of 40 MHz or more (e.g., a frequency of 60 MHz). The matching unit 20a may match the internal impedance of the radio-frequency power supply 20b with the load impedance. The radio frequency from the radio-frequency power supply 20b may be pulsed.

The outer upper electrode 21 is disposed to surround the inner upper electrode 22. A ring-shaped dielectric (not illustrated) is interposed between the outer upper electrode 21 and the inner upper electrode 22. Further, a ring-shaped insulating shield member (not illustrated) made of, for example, alumina is airtightly interposed between the outer upper electrode 21 and the inner peripheral wall of the processing container 10. The outer upper electrode 21 is connected to the matching unit 20a and the radio-frequency power supply 20b via a feeding cylinder 211, a connector 23, and the upper electrode rod 24. The feeding cylinder 211 is formed, for example, in a substantially cylindrical shape with an open lower surface, and the lower end thereof is connected to the outer upper electrode 21. The lower end of the upper electrode rod 24 is electrically connected to the center of the upper surface of the feeding cylinder 211 by the connector 23. The upper end of the upper electrode rod 24 is connected to the output side of the matching unit 20a.

Figure 2:
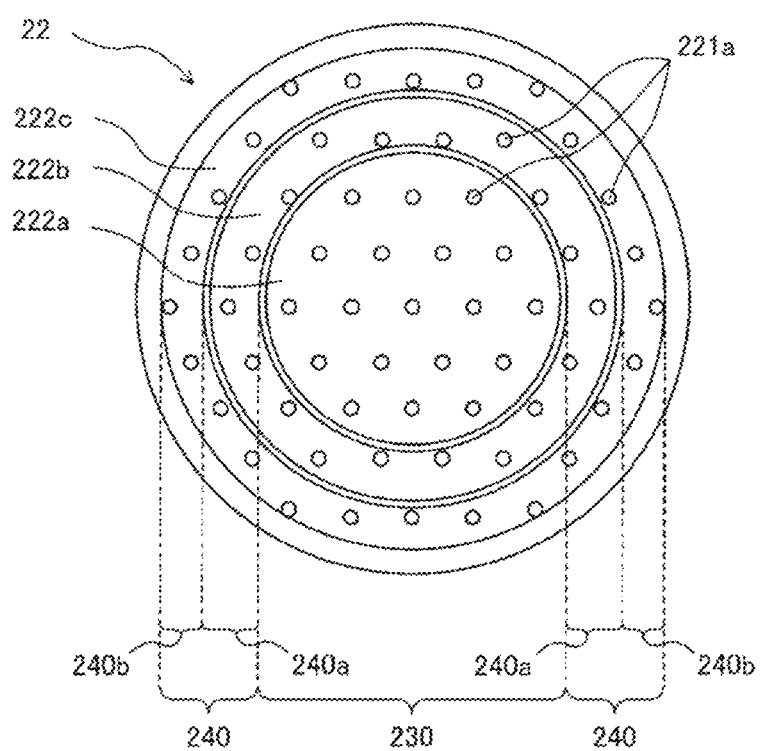
FIG. 2 is a bottom view illustrating the configuration of an inner upper electrode according to the embodiment.

The inner upper electrode 22 constitutes a shower head that discharges a desired gas toward the plasma generation space S on the substrate W supported by the substrate support 11. The inner upper electrode 22 includes a disk-shaped electrode plate 221 having multiple gas introduction holes 221a (see, e.g., FIG. 2) and an electrode support 222 that detachably supports the upper surface of the electrode plate 221. The electrode support 222 is formed in a disk shape having substantially the same diameter as the electrode plate 221.

As illustrated in FIG. 1, a matching unit 20a and a radio-frequency power supply 20b are connected to the upper surface of the electrode support 222 via a lower electrode rod 25, a connector 23, and an upper electrode rod 24. A variable capacitor 26 is provided in the middle of the lower electrode rod 25. By adjusting the capacitance of the variable capacitor 26, when the second radio-frequency voltage is applied from the radio-frequency power supply 20b, it is possible to adjust a relative ratio between the electric field strength formed directly under the outer upper electrode 21 and the electric field strength formed directly under the inner upper electrode 22.

In the embodiment, the inner upper electrode 22 includes a plurality of gas introduction units (e.g., two in the present embodiment) for introducing a gas toward different regions in the surface of the substrate W supported by the substrate support 11, for example, a central region (hereinafter, a "center region") of the substrate W and a peripheral region (hereinafter, an "edge region") of the substrate W, respectively. Hereinafter, the two gas introduction units are referred to as a first gas introduction unit 230 that introduces a gas into the center region and a second gas introduction unit 240 that introduces a gas into the edge region, respectively.

The first gas introduction unit 230 serving as a first supply unit includes a buffer chamber 222a formed inside the electrode support 222 and multiple gas introduction holes 221a formed on the lower surface thereof. The buffer chamber 222a is formed to correspond to the inside in the central region of the electrode support 222, that is, the center region of the substrate W which is adsorbed and held by the substrate support 11.

The second gas introduction unit is further divided into a processing gas introduction unit 240a for introducing a processing gas from a processing gas supply unit 31 (to be described later) into the processing container 10 and an additional gas introduction unit 240b for introducing an additional gas to be added to the processing gas introduced from the processing gas introduction unit 240a from an additional gas supply unit 33 (to be described later) into the processing container 10. The processing gas introduction unit 240a is disposed to surround the periphery of the first gas introduction unit 230. The additional gas introduction unit 240b is disposed to surround the periphery of the processing gas introduction unit 240a. In other words, the first gas introduction unit 230, the processing gas introduction unit 240a, and the additional gas introduction unit 240b are disposed in this order from the radial inside of the inner upper electrode 22.

The processing gas introduction unit 240a serving as a second supply unit includes a buffer chamber 222b formed inside the electrode support 222 and multiple gas introduction holes 221a formed on the lower surface thereof. The additional gas introduction unit 230 serving as a third supply unit includes a buffer chamber 222c formed inside the electrode support 222 and multiple gas introduction holes 221a formed on the lower surface thereof. The buffer chambers 222b and 222c are formed to correspond to the inside in the peripheral region of the electrode support 222, that is, the edge region of the substrate W which is adsorbed and held by the substrate support 11.

The buffer chambers 222a, 222b, and 222c may be formed independently inside, for example, the electrode support 222. For example, an integrated buffer chamber may be formed inside the electrode support 222, and the integrated buffer chamber may be partitioned and formed by, for example, an O-ring.

Then, a gas according to the purpose is supplied from the gas supply unit 30 to each of the buffer chambers 222a, 222b, and 222c, the gas is discharged to the center region of the substrate W via the buffer chamber 222a of the first gas introduction unit 230, and the gas is discharged to the edge region of the substrate W via the buffer chamber 222b or 222c of the second gas introduction unit 240.

A cylindrical ground conductor 250 including a side wall having substantially the same diameter as the processing container 10 is provided outside the feeding cylinder 211 connected to the outer upper electrode 21. In other words, the feeding cylinder 211 is covered with the ground conductor 250. The lower end of the ground conductor 250 is connected to the upper part of the side wall of the processing container 10. The above-mentioned upper electrode rod 24 penetrates through the center of the upper surface of the ground conductor 250. An insulating member (not illustrated) is interposed at a contact portion between the ground conductor 250 and the upper electrode rod 24.

Further, a low-pass filter 260 is electrically connected to the inner upper electrode 22 of the upper electrode 20. The low-pass filter 260 blocks a radio frequency from the radio-frequency power supply 20b connected to the upper electrode 20 and passes a radio frequency from the radio-frequency power supply 114b connected to the lower electrode to the ground.

In the present embodiment, descriptions have been made on the case where the inner upper electrode 22 includes the first and second gas introduction unit 230 and 240 in order to introduce a gas toward each of the center region and the edge region in the surface of the substrate W, but the configuration of the inner upper electrode 22 is not limited thereto. In other words, in the present embodiment, the surface of the substrate W is divided into two regions, that is, the center region and the edge region, but the number of divisions of the regions formed in the surface of the substrate W is not limited to two.

That is, for example, the center region of the substrate W (and the first gas introduction unit 230 of the inner upper electrode 22) may be further divided into a plurality of different regions or the edge region (and the second gas introduction unit 240 of the inner upper electrode 22) may be further divided into a plurality of different regions.

Descriptions will be made by referring back to FIG. 1.

The gas supply unit 30 includes a processing gas supply unit 31 for supplying a processing gas for etching the substrate W, a partial flow rate adjusting unit 32 for adjusting a partial flow rate of the processing gas from the processing gas supply unit 31, and an additional gas supply unit 33 for supplying a desired additional gas.

The processing gas supply unit 31 is connected to the buffer chamber 222a of the first gas introduction unit 230 and the buffer chamber 222b of the second gas introduction unit 240 in the inner upper electrode 22 via the partial flow rate adjusting unit 32 (e.g., a flow splitter). The partial flow rate adjusting unit 32 adjusts the partial flow rate of the processing gas with respect to the buffer chambers 222a and 222b based on the pressure in the buffer chambers 222a and 222b (e.g., the pressure in connection pipes 34 and 35 for connecting the processing gas supply unit 31 and the buffer chambers 222a and 222b, respectively).

Figure 3:
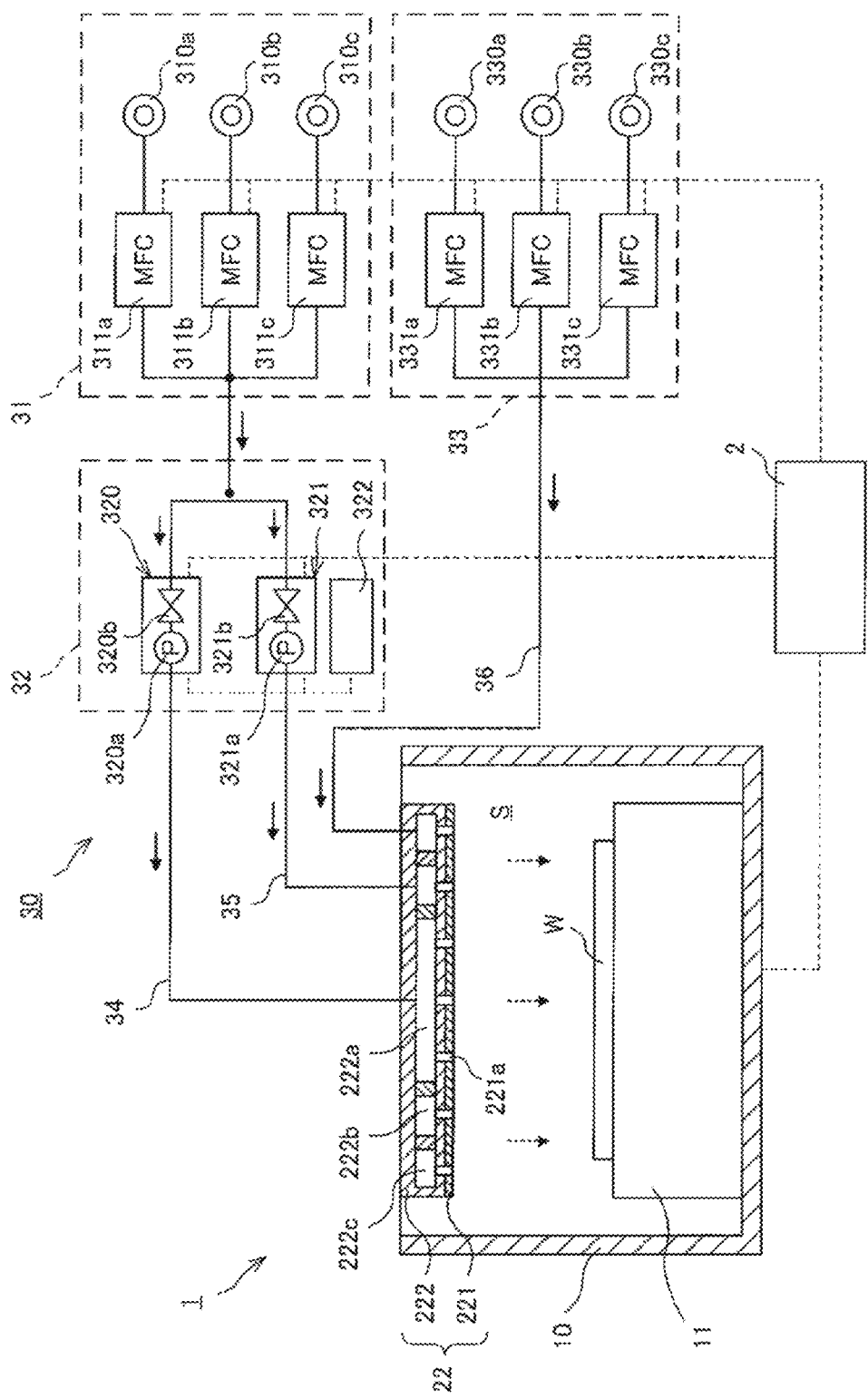
FIG. 3 is a system diagram illustrating the configuration of a gas supply unit according to the embodiment.

As illustrated in FIG. 3, in the embodiment, the processing gas supply unit 31 is constituted by a gas box in which a plurality of (e.g., three in the illustrated example) gas supply sources 310a, 310b, and 310c is accommodated. The respective gas supply sources 310a, 310b, and 310c are connected to the partial flow rate adjusting unit 32 via the corresponding flow rate controllers 311a, 311b, and 311c, respectively. Each of the flow rate controllers 311a, 311b, and 311c may include, for example, a mass flow controller or a pressure-controlled flow rate controller.

The gas supply source 310a is filled with, for example, a gas represented by $C_xH_yF_z$ (y≥0), such as $CF_4$, $C_4F_8$, $CHF_3$, and $CH_2F_2$, as an etching gas.

The gas supply source 310b is filled with, for example, $O_2$ gas as a gas for controlling a CF-based reaction product.

The gas supply source 310c is filled with an inert gas, such as Ar, $N_2$, or COS, as a carrier gas.

The number of gas supply sources of the processing gas supply unit 31 is not limited to the illustrated example, and may be, for example, one, two, or four or more. Further, the type of gas supplied from the processing gas supply unit 31 is not limited to the above example, and a gas such as CO, $CO_2$, or $H_2$ may be further supplied in place of or in addition to the above gas.

The partial flow rate adjusting unit 32 includes a pressure adjusting unit 320 for adjusting the pressure in the connection pipe 34 connecting the processing gas supply unit 31 and the buffer chamber 222a, and a pressure adjusting unit 321 for adjusting the pressure in the connection pipe 35 connecting the processing gas supply unit 31 and the buffer chamber 222b. Specifically, the pressure adjusting unit 320 includes a pressure sensor 320a for detecting the pressure in the connection pipe 34 and a valve 320b for adjusting the opening/closing degree of the connection pipe 34. Further, the pressure adjusting unit 321 includes a pressure sensor 321a for detecting the pressure in the connection pipe 35 and a valve 321b for adjusting the opening/closing degree of the connection pipe 35.

The pressure adjusting units 320 and 321 are connected to a pressure controller 322. The pressure controller 322 adjusts the opening/closing degree of the corresponding valves 320b and 321b based on the pressure detected from the pressure sensors 320a and 321a. The operation of the pressure controller 322 is controlled by, for example, the control unit 2.

The connection pipes 34 and 35 connecting the processing gas supply unit 31 and the buffer chambers 222a and 222b may be branched inside the partial flow rate adjusting unit 32 as illustrated in FIGS. 1 and 3, or may be branched outside the partial flow rate adjusting unit 32.

The additional gas supply unit 33 is connected to the buffer chamber 222c of the second gas introduction unit 240 in the inner upper electrode 22 via the connection pipe 36.

As illustrated in FIG. 3, in the embodiment, the additional gas supply unit 33 is constituted by a gas box in which a plurality of (e.g., three in the illustrated example) gas supply sources 330a, 330b, and 330c is accommodated. The respective gas supply sources 330a, 330b, and 330c are connected to the buffer chamber 222c via the corresponding flow rate controllers 331a, 331b, and 331c, respectively. Each of the flow rate controller 331a, 331b, and 331c may include, for example, a mass flow controller or a pressure-controlled flow rate controller.

The gas supply source 330a is filled with a CF-based gas capable of promoting etching, for example, a $C_xF_y$ gas such as $C_4F_8$.

The gas supply source 330b is filled with, for example, $O_2$ gas as a gas for controlling the CF-based reaction product. Further, as illustrated in FIG. 3, for example, the gas supply source 330b may be filled with a second carbon-containing gas (e.g., $CO_2$ gas) as a gas for improving the efficiency of a plasma cleaning process (to be described later).

The gas supply source 330c is filled with, for example, a CF-based gas represented by $C_xH_yF_z$ (y≥0, x/z>¼) which is a first carbon-containing gas, such as $C_3F_8$, $C_4F_6$, $C_4F_8$, $CHF_3$, and $CH_2F_2$, as a plasma cleaning gas (hereinafter, simply referred to as a "cleaning gas") for removing the reaction product attached to the bevel portion or the back surface of the substrate W after etching or the front surface of the substrate support 11.

The number of gas supply sources of the additional gas supply unit 33 is not limited to the illustrated example, and may be, for example, one, two, or four or more. The cleaning gas may be supplied from the gas supply source 330a by omitting, for example, the gas supply source 330c.

Description will be made by referring back to FIG. 1.

The exhaust system 40 may be connected to, for example, a gas outlet 10e provided at the bottom of the processing container 10. The exhaust system 40 may include a pressure adjusting valve and a vacuum pump. The internal pressure of the processing container 10 is adjusted by the pressure adjusting valve. The vacuum pump may include a turbo molecular pump, a dry pump, or a combination of the two pumps.

The control unit 2 processes computer-executable instructions that cause the plasma processing apparatus 1 to perform the various steps described in the present disclosure. The control unit 2 may be configured to control each element of the plasma processing apparatus 1 to perform the various steps described herein. In the embodiment, a part of or all elements of the control unit 2 may be included in the plasma processing apparatus 1. The control unit 2 may include, for example, a computer 2a. The computer 2a may include, for example, a processing unit (CPU) 2a1, a storage unit 2a2, and a communication interface 2a3. The processing unit 511 may be configured to perform various control operations based on the program stored in the storage unit 512. The storage unit 2a2 may include a RAM, a ROM, an HDD, a solid state drive (SSD), or a combination thereof. The communication interface 2a3 may communicate with the plasma processing apparatus 1 via a communication line such as a LAN.

Although various embodiments have been described above, the present disclosure is not limited to the embodiments described above, and various omissions, substitutions, and changes may be made. In addition, it is possible to combine the elements in other embodiments to form other embodiments.

For example, in the present embodiment, the case where the plasma processing system includes a parallel plate type plasma processing apparatus 1 has been described as an example, but the configuration of the plasma processing system is not limited thereto. For example, the plasma processing system may include a processing apparatus that includes a plasma generation unit such as a capacitively-coupled plasma (CCP), an inductively-coupled plasma (ICP), an electron-cyclotron-resonance (ECR) plasma, a helicon-wave plasma (HWP), or a surface-wave plasma (SWP). Further, a processing apparatus that includes various types of plasma generation units including an alternating-current (AC) plasma generation unit and a direct-current (DC) plasma generation unit may be used.

<Plasma Processing Method>

Figure 4:
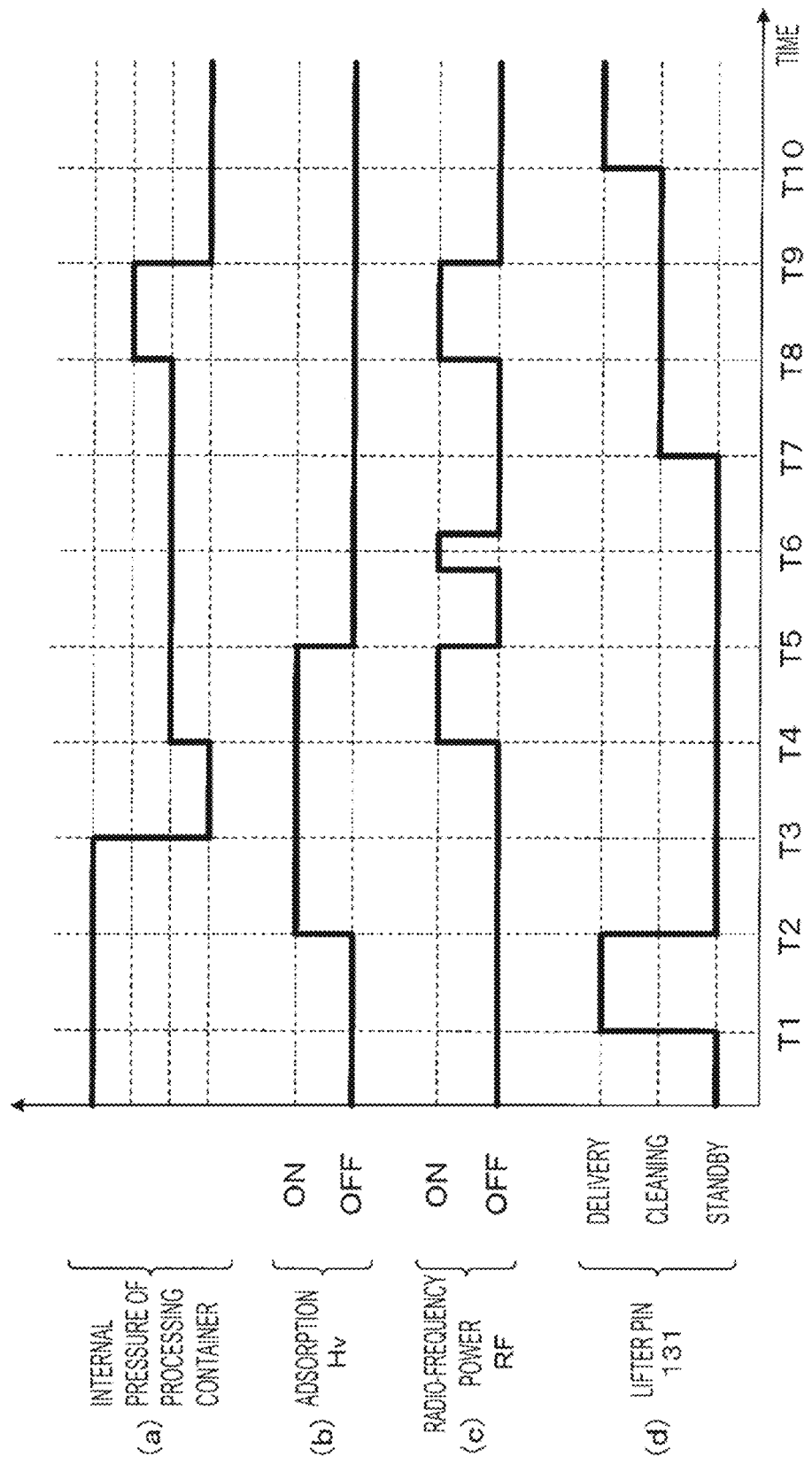
FIG. 4 is a timing chart of a plasma process according to the embodiment.

Next, descriptions will be made on a plasma processing method for the substrate W, which is performed using the plasma processing system configured as described above. FIG. 4 illustrates a timing chart of a plasma process according to the embodiment. In FIG. 4, the horizontal axis represents time, and the vertical axis represents (a) the internal pressure of the processing container 10, (b) the application of a DC voltage to the adsorption electrode 115a, (c) the application of a radio-frequency (RF) voltage, and (d) the height position of the tip of the lifter pin 131, respectively.

Figure 5:
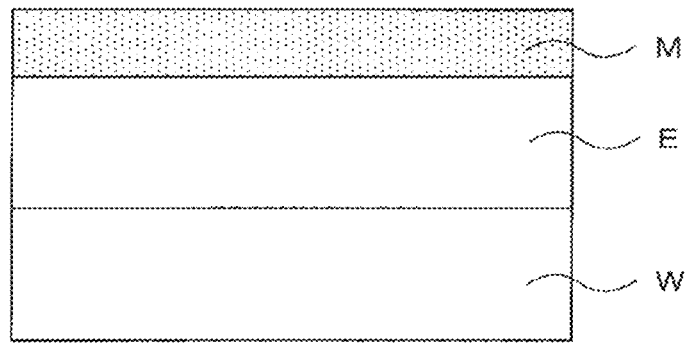
FIG. 5 is a view illustrating an etching target layer and a mask layer formed on a substrate.

In the present embodiment, as illustrated in FIG. 5, a case where the substrate W in which the etching target layer E made of a low dielectric constant (low-k) material and the mask layer M are stacked on the surface is etched will be described as an example. In the embodiment, the low-dielectric constant (low-k) material refers to a material having a dielectric constant smaller than at least that of $SiO_2$ (dielectric constant: about 4.0), and the low-dielectric constant (low-k) material may be, for example, a Si-containing material such as SiOC or SiOCH. Further, the etching target layer E (low-k material) may be porous.

First, the substrate W in which the above-mentioned etching target layer E and mask layer M are formed on the surface is carried into the processing container 10 by a substrate transfer robot (not illustrated) provided outside the plasma processing apparatus 1. When the substrate W is carried into the processing container 10, the lifter pin 131 is raised from the standby position to the delivery position by the operation of the actuator 132, and the substrate W is delivered from the substrate transfer robot to the lifter pin 131 (see, e.g., "T1" in FIG. 4). At the delivery position, while the substrate W is separated from the substrate mounting surface of the substrate support 11 (e.g., electrostatic chuck 115) without being in contact with the substrate mounting surface, the back surface thereof is held by the upper end of the lifter pin 131.

When the substrate W is delivered to the upper end of the lifter pin 131, the lifter pin 131 is lowered from the delivery position to the standby position by the operation of the actuator 132, and the substrate W is delivered from the lifter pin 131 to the substrate mounting surface of the electrostatic chuck 115 (see, e.g., "T2" in FIG. 4). In other words, the operation of the actuator 132 moves the substrate W from the delivery position to the processing position. Subsequently, by applying a DC voltage to the adsorption electrode 115a of the electrostatic chuck 115, the substrate W is adsorbed and held on the substrate mounting surface of the electrostatic chuck 115 by electrostatic force.

Subsequently, after the inside of the processing container 10 is sealed, the first gas is supplied from the gas supply unit 30 to the plasma generation space S, and plasma derived from the first gas is generated. Then, etching is started on the substrate W which is adsorbed and held on the substrate mounting surface (see, e.g., "T4" in FIG. 4). The above-mentioned "first gas" used for etching includes the processing gas from the processing gas supply unit 31 and the additional gas from the additional gas supply unit 33.

Specifically, first, supply of the processing gas for etching (e.g., $C_xH_yF_z$ gas, $O_2$ gas, and Ar gas) by the processing gas supply unit 31 is started, and supply of the additional gas (e.g., $C_xF_y$ gas and $O_2$ gas) by the additional gas supply unit 33 is started.

Further, a radio-frequency voltage is supplied to the susceptor 114 (e.g., a lower electrode) and the upper electrode 20 of the substrate support 11, whereby plasma is generated by the first gas supplied to the inside of the plasma generation space S.

Subsequently, when a desired etching result is obtained for the etching target layer E, the etching in the plasma processing apparatus 1 is completed.

As described above, the reaction product adheres as a foreign substance to the bevel portion or the back surface of the substrate W, or the front surface of the substrate support 11 by the etching performed in the plasma processing apparatus 1. The reaction product attached to the substrate W and the substrate support 11 may cause, for example, a problem in the apparatus or a problem in the processing result for the substrate W.

Therefore, in the plasma processing apparatus 1 according to the present embodiment, after the etching on the substrate W is completed, a plasma cleaning process for removing the reaction product attached to the substrate W inside the same processing container 10 (hereinafter, may be simply referred to as a "cleaning process") is performed.

When the cleaning process to the substrate W is started, the supply of the DC voltage to the adsorption electrode 115a of the electrostatic chuck 115 is stopped, so that generation of the electrostatic force is stopped between the electrostatic chuck 115 and the substrate W.

The cleaning process for the substrate W (to be described later) is performed in a state where the substrate W is detached from the substrate mounting surface by the lifter pin 131. However, as described above, simply stopping the supply of the DC voltage to the adsorption electrode 115a causes the substrate W to remain adsorbed and held on the substrate mounting surface due to the influence of, for example, residual charge. Thus, there is a concern that the substrate W may not be raised appropriately by the lifter pin 131.

Therefore, in the present embodiment, a radio-frequency voltage is instantaneously applied to the substrate support 11 before raising the substrate W by the lifter pin 131 (see, e.g., "T6" in FIG. 4). As a result, the influence of residual charge between the substrate W and the substrate mounting surface is removed, and the adsorption and holding of the substrate W by the electrostatic chuck 115 is appropriately stopped.

From the viewpoint of appropriately detaching the substrate W from the electrostatic chuck 115 in this way, an inert gas (e.g., Ar gas) instead of the first gas described above may be supplied from the gas supply unit 30 to the plasma generation space S from the end of etching in the plasma processing apparatus 1 to the start of the cleaning process described later.

When a radio-frequency voltage is applied to the substrate support 11, the lifter pin 131 is subsequently raised from the standby position to the cleaning position by the operation of the actuator 132, and the substrate W is delivered from the electrostatic chuck 115 (e.g. a substrate mounting surface) to the lifter pin 131 (see, e.g., "T7" in FIG. 4). At the cleaning position, while the substrate W is separated from the substrate mounting surface of the electrostatic chuck 115 without being in contact with the substrate mounting surface thereof, the back surface thereof is held at the upper end of the lifter pin 131.

The height position of the tip of the lifter pin 131 in the cleaning (e.g., the separation distance between the back surface of the substrate W and the substrate mounting surface of the electrostatic chuck 115) is controlled to 2.0 mm or more and 4.0 mm or less, may be to 2.5 mm or more and 3.8 mm or less, and may be to 3.0 mm or more and 3.5 mm or less.

When the substrate W is held at the upper end of the lifter pin 131, a second gas is subsequently supplied from the gas supply unit 30 to the plasma generation space S, plasma is generated from the second gas, and the cleaning process of the substrate W is started (see, e.g., "T8" in FIG. 4). The above-mentioned "second gas" used for the cleaning process includes a cleaning gas from the additional gas supply unit 33. In the present embodiment, in addition to the $C_xH_yF_z$ gas supplied from the gas supply source 330c described above, the $CO_2$ gas supplied from the gas supply source 330b is included in the cleaning gas.

Specifically, first, the supply of the cleaning gas (e.g., $C_xH_yF_z$ gas and $CO_2$ gas) by the additional gas supply unit 33 is started.

A radio-frequency voltage is supplied to the susceptor 114 (e.g. a lower electrode) or the upper electrode 20 of the substrate support 11, whereby plasma is generated by the second gas supplied to the inside of the plasma generation space S.

As a result of diligent studies conducted by the present inventors, when the etching target layer E includes a Si-containing material as a low dielectric constant (low-k) material as described above, it is found that CF-based polymers and Si are contained as reaction products attached to the substrate W during etching.

Further, as a result of diligent studies conducted by the present inventors, when a plasma cleaning process using $CO_2$ gas is carried out on the reaction product generated as described above, it is found that only the Si component is detected as a residue after the plasma cleaning process. In other words, it is found that the reaction product, which is a CF-based polymer component, may be removed by the plasma cleaning process using $CO_2$ gas, but the reaction product, which is a Si component, may not be removed and remains.

When the reaction product containing Si is removed by the plasma cleaning process, for example, a CF-based gas is added to the cleaning gas. However, when a CF-based gas having a low carbon (C) ratio is added as a cleaning gas, there are concerns about the influence on the surface of the substrate W, such as the wear of the mask layer M, the liner film, and the low-k film or the expansion of the critical dimension (CD). Therefore, when the CF-based gas is added to the cleaning gas to remove the reaction product containing Si, the gas type, flow rate, and other parameters that have a small effect on the surface of the substrate W may be adjusted.

Therefore, in the present embodiment, in order to appropriately remove the reaction product attached to the substrate W, the plasma cleaning process of the substrate W is performed under the conditions below as an example. The processing conditions mentioned below are all examples, and the processing conditions for etching may be appropriately selected.

Second gas (cleaning gas)
Flow rate of $C_xH_yF_z$ gas (y≥0, x/z>¼): 1 sccm to 5 sccm
Flow rate of $CO_2$ gas: 500 sccm to 1200 sccm
Pressure of the plasma generation space S: 300 mTorr to 800 mTorr
Temperature of the substrate W: 10° C. to 60° C.
Radio-frequency power: 500 W to 600 W
Frequency of radio-frequency power: 10 MHz to 100 MHz
Height of the tip of the lifter pin 131: 2.0 mm to 4.0 mm Specifically, in the cleaning process according to the present embodiment, the CF-based polymer as a reaction product is removed by the plasma generated from $CO_2$ gas, and the Si component as a reaction product is removed by plasma generated from $C_xH_yF_z$ gas (e.g. a CF-based gas) having a sufficiently small flow rate with respect to the flow rate of $CO_2$ gas (e.g., a flow rate ratio of 1% or less with respect to $CO_2$ gas). In other words, since the CF-based polymer as a reaction product and the Si component may be removed at the same time, the cleaning efficiency may be improved.

At this time, by using a gas represented by $C_xH_yF_z$ (y≥0, x/z>¼), more specifically, a gas richer in carbon (C) than $CF_4$ gas as the CF-based gas included in the cleaning gas, it is possible to appropriately remove the Si component of the reaction product while protecting the low-k film formed on the surface of the substrate W.

When a CF-based gas (e.g., $CF_4$ gas) having a small carbon (C) ratio represented by $C_xH_yF_z$ (x/z≤¼) is used, it is found that the etching target layer E may be etched during the cleaning process. In this case, for example, the pattern (hole) formed in the etching target layer E becomes deeper, which may damage the wiring of the substrate formed in the lower layer of the etching target layer E. Therefore, a gas represented by $C_xH_yF_z$ (y≥0, x/z>¼) may be used as the CF-based gas included in the cleaning gas.

Further, in the present embodiment, the cleaning process is performed in a state where the substrate W is separated from the substrate mounting surface of the electrostatic chuck 115 by the lifter pin 131. Thus, plasma may be appropriately introduced into the space generated between the back surface of the substrate W and the substrate mounting surface, and as a result, the reaction product attached to the bevel portion or the back surface of the substrate W or the front surface of the electrostatic chuck 115 may be appropriately removed.

At this time, by setting the height position of the tip of the lifter pin 131 (the separation distance between the back surface of the substrate W and the substrate mounting surface) to 2.0 mm or more and 4 mm or less, more preferably 3.0 mm or more and 3.5 mm or less, plasma is suppressed from excessively penetrating between the back surface of the substrate W and the surface of the electrostatic chuck, and damage to the back surface of the substrate W or the surface of the electrostatic chuck is suppressed.

When the height position of the tip of the lifter pin 131 (e.g., the separation distance between the back surface of the substrate W and the substrate mounting surface) is set to be smaller than 2.0 mm, it may not be possible to appropriately remove the reaction product in the edge region (bevel portion) of the substrate W. Meanwhile, when the height position of the tip of the lifter pin 131 (e.g., the separation distance between the back surface of the substrate W and the substrate mounting surface) is set to be larger than 4.0 mm, etching (cleaning) proceeds to the vicinity of the center of the back surface of the substrate W.

Further, in the present embodiment, as illustrated in the above-mentioned apparatus configuration (see, e.g., FIG. 1), a cleaning gas for cleaning the substrate W may be supplied from the additional gas introduction unit 240*b* in the inner upper electrode 22 corresponding to the edge region of the substrate W.

The reaction product generated during the etching tends to be easily attached to the bevel portion (e.g., an edge region) of the substrate W or the surface of the substrate support 11 along the bevel portion.

As described in the present embodiment, since the additional gas is supplied from the additional gas introduction unit 240*b* corresponding to the bevel portion (e.g., an edge region), the reaction product attached to the bevel portion may be removed, and, for example, the effect on the center region of the substrate W is suppressed.

Further, in the present embodiment, the pressure of the plasma generation space S at the time of the cleaning process may be any pressure as long as the plasma is stably maintained, and is set to 300 mTorr or more as an example. By performing the cleaning process using the pressure region of 300 mTorr or more in this way, it is possible to improve the removal rate of reaction products in the bevel portion while ensuring the uniformity of the cleaning process for the substrate W in the circumferential direction, in other words, the uniformity of concentric circles.

Subsequently, when the removal of the reaction product attached to the substrate W is completed, the supply of the radio-frequency voltage to the susceptor 114 (e.g., a lower electrode) or the upper electrode 20 of the substrate support 11 is stopped, and the cleaning process for the substrate W is completed (see, e.g., "T9" in FIG. 4). At this time, the exhaust system 40 exhausts the second gas remaining inside the processing container 10 to the outside of the processing container 10.

Subsequently, the lifter pin 131 is raised from the cleaning position to the delivery position by the operation of the actuator 132, and the substrate W is delivered from the lifter pin 131 to the substrate transfer robot (not illustrated) (see, e.g., "T10" in FIG. 4).

Subsequently, when the substrate W is transferred to the outside of the processing container 10 by the substrate transfer robot (not illustrated), a series of plasma process (e.g., etching and cleaning processes) in the plasma processing apparatus 1 is completed.

Effects of Techniques Described in the Present Disclosure

As an example of experimental results representing the effects of the techniques of the present disclosure, FIG. 6 illustrates a surface state of the substrate W which has not been subjected to a cleaning process after etching (Reference Example 1), a surface state of the substrate W which has been subjected to the cleaning process using only $CO_2$ gas after etching (Reference Example 2), and a surface state of the substrate W which has been subjected to the cleaning process using $CO_2$ gas and $C_4F_8$ gas after etching (embodiment).

As illustrated in FIG. 6, by using a cleaning gas containing $CO_2$ gas and $C_4F_8$ gas in the plasma cleaning process, the CF-based polymer as a reaction product and the Si component may be removed without causing a large process variation from Reference Examples 1 and 2. More specifically, as indicated in the "BARC Remain value," "CD value," or "Recess value" of FIG. 6, although slight process fluctuations are observed due to the addition of $C_4F_8$ gas, it is found that the fluctuation values are within the allowable range that may be adjusted by the processing conditions.

Then, according to the present embodiment, the reaction product attached to the substrate W in the etching may be removed by the added $C_4F_8$ gas and $CO_2$ gas without affecting the processing result of the substrate W in this way.

Figure 7:
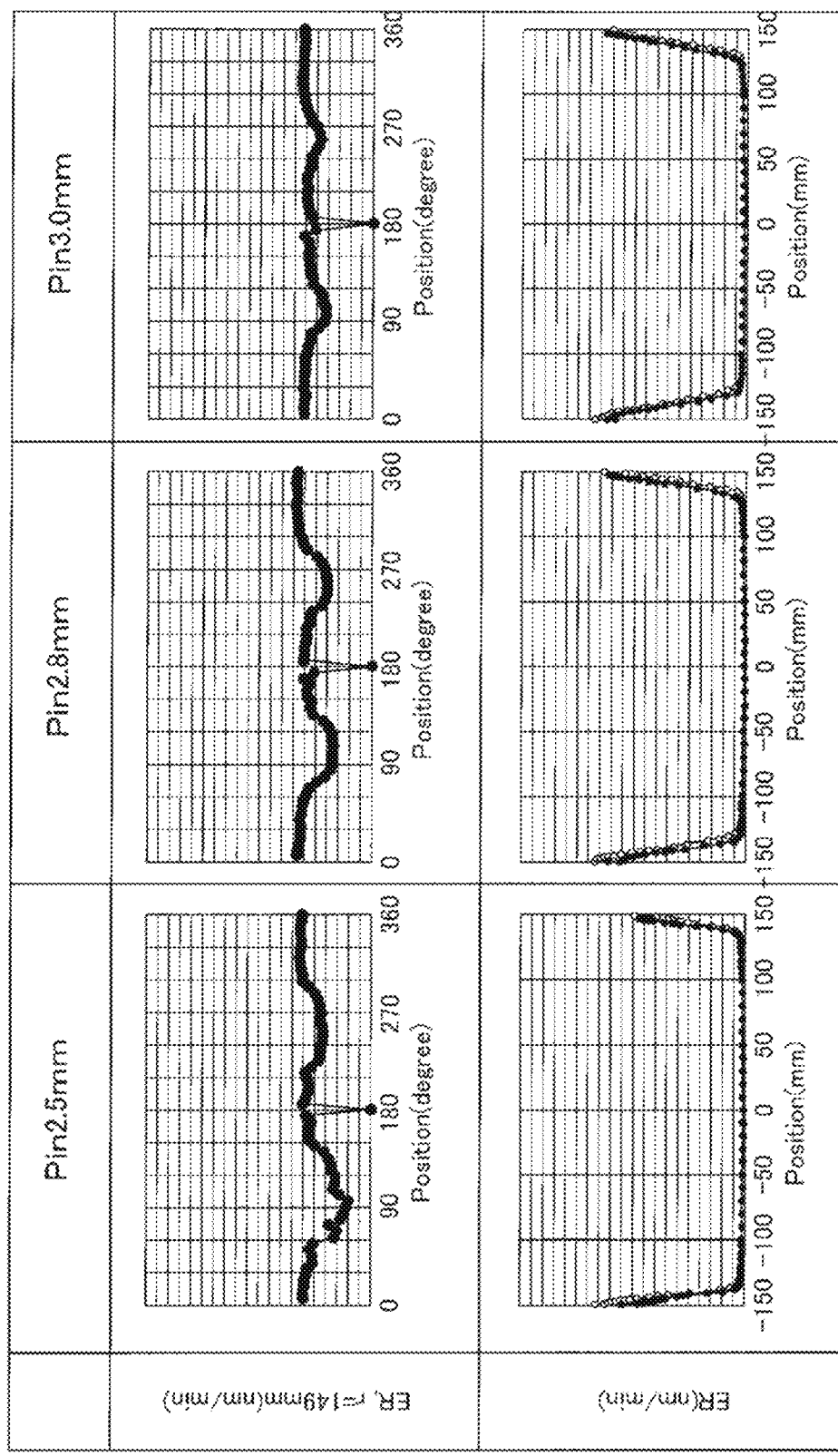
FIG. 7 is a view illustrating an example of a plasma processing result according to an experimental example.
Figure 8:
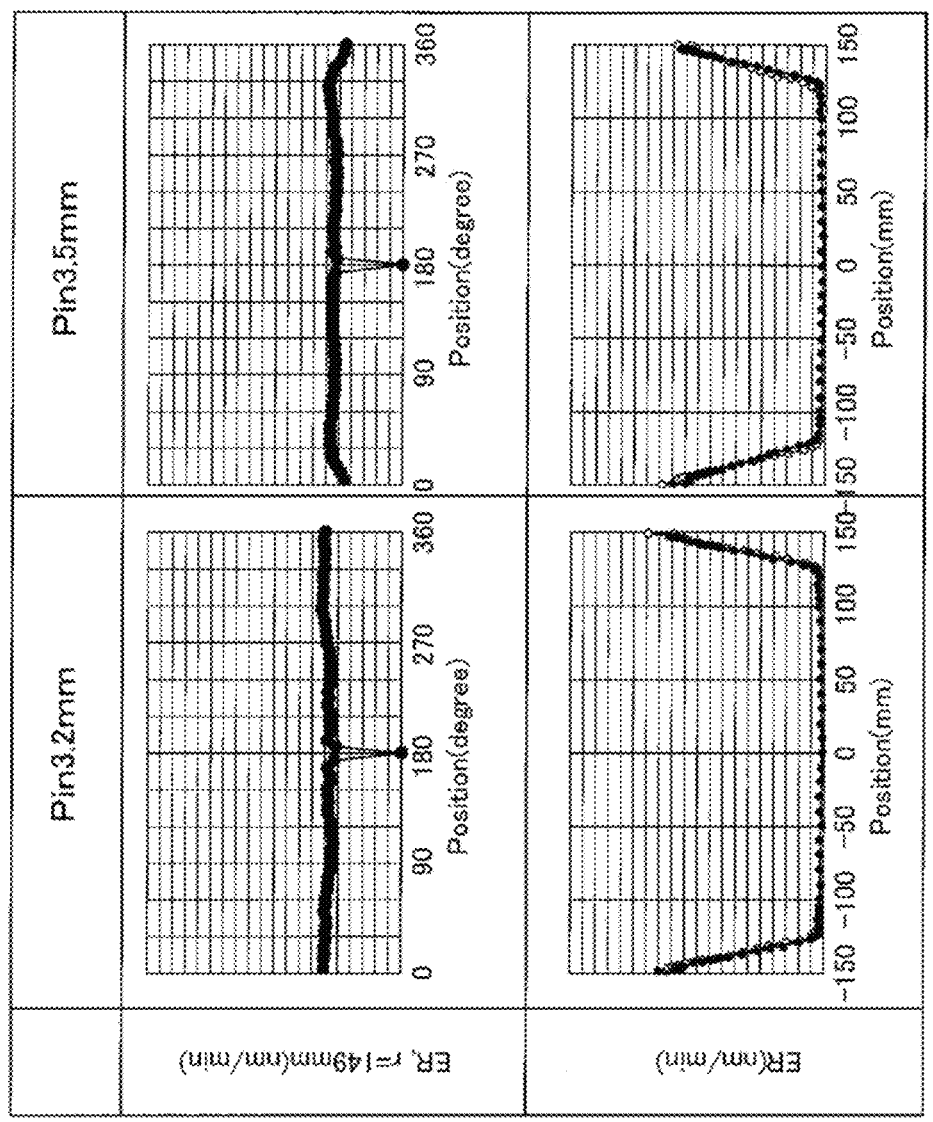
FIG. 8 is a view illustrating an example of the plasma processing result according to the experimental example.

FIGS. 7 and 8 are graphs illustrating examples of simulation experiment results that indicate a relationship between the plasma etching amount of the etching target layer E formed on the back surface of a dummy substrate and the height of the tip of the lifter pin 131 (e.g., the separation distance between the substrate W and the electrostatic chuck 115). In FIGS. 7 and 8, the upper graphs focus on the distribution of the reaction product amounts in the peripheral portion of the back surface of the substrate W, and the lower graphs focus on the distribution of the reaction product amounts in the diameter direction on the back surface of the substrate W The vertical axes of the upper graphs in FIGS. 7 and 8 represent the amounts of reaction products attached to the periphery of the back surface of the substrate W, and the horizontal axes represent the azimuth angle of the back surface of the substrate W when a notch portion viewed from the center of the back surface of the substrate W is 180°. The vertical axes of the lower graphs in FIGS. 7 and 8 represent the amounts of the reaction product attached to the back surface of the substrate W, and the horizontal axes represent the position in the diameter direction of the back surface of the substrate W when the center of the back surface of the substrate W is 0 mm.

As may be seen from the simulation experiment results illustrated in FIGS. 7 and 8, by setting the height of the lifter pin 131 to at least 2.0 mm or more (e.g., FIG. 7 illustrates that the height of the lifter pin 131 is 2.5 mm or more), the reaction product attached to the bevel portion (e.g., an edge region) of the substrate W may be removed.

Further, by setting the height of the lifter pin 131 to at least 4.0 mm or less (e.g., FIG. 7 illustrates that the height of the lifter pin 131 is 3.5 mm or less), it is possible to suppress the progress of etching on the center (e.g., a center region) of the back surface of the substrate W.

As illustrated in FIGS. 7 and 8, in particular, the etching amount distribution may be made uniform over the entire circumference in the edge region of the substrate W by setting the height of the lifter pin 131 to 2.5 mm or more and 3.8 mm or less, or 3.0 mm or more and 3.5 mm or less.

As may be seen from the results illustrated in FIGS. 6 to 8, according to the plasma processing method of the substrate W of the present embodiment, a small flow rate of $C_xH_yF_z$ ($y \geq 0$, $x/z > \frac{1}{4}$), for example, $C_4F_8$ gas is added to a large flow rate of $CO_2$ gas as a cleaning gas to remove the reaction product generated during etching, both the CF-based polymer as the reaction product and the Si component generated thereby may be removed even when the etching target layer E formed on the surface of the substrate W includes a low-dielectric constant (low-k) material.

In particular, according to the present embodiment, a relatively carbon (C)-rich gas represented by $x/z > \frac{1}{4}$ is used as the $C_xH_yF_z$ gas to be added to the cleaning gas, so that the Si component of the reaction product may be removed while appropriately protecting the low-k film formed on the surface of the substrate W.

According to the present embodiment, the cleaning process is performed in a state controlled such that the substrate W is detached from the substrate mounting surface of the electrostatic chuck 115 by the lifter pin 131, particularly, the separation distance between the back surface of the substrate W and the substrate mounting surface of the electrostatic chuck 115 is 2 mm or more and 4 mm or less. Thus, the plasma generated in the plasma generation space S may appropriately remove the reaction product attached to the bevel portion or the back surface of the substrate W, or the front surface of the electrostatic chuck 115.

Further, according to the present embodiment, the introduction of the cleaning gas into the plasma generation space S during the cleaning process may be performed from the additional gas introduction unit 240b corresponding to the edge region which is a main adhesion region of the reaction product to the substrate W. More specifically, the cleaning gas may be introduced from the outermost periphery of the inner upper electrode 22 in which the gas introduction hole 221a is formed toward the edge region of the corresponding substrate W. As a result, the reaction product attached to the edge region of the substrate W may be removed, and the influence of the substrate W on the center region may be suppressed.

According to the above-described embodiment, the cleaning gas is supplied only from the additional gas introduction unit 240b located at the outermost periphery of the inner upper electrode 22, but the supply position of the cleaning gas may be appropriately changed according to, for example, the position where the reaction product adheres to the substrate W. In other words, the additional gas supply unit 33 for supplying the cleaning gas may be connected to the buffer chamber 222a corresponding to the center region of the substrate W, and the buffer chamber 222b corresponding to the edge region of the substrate W, instead of or in addition to the buffer chamber 222c formed inside the electrode support 222.

As described above, the arrangement, shape, and number of buffer chambers formed inside the electrode support 222 are not limited to the example of the above-described embodiment, and may be appropriately changed according to, for example, the position where the reaction product adheres to the substrate W.

According to the present disclosure, reaction products attached to the bevel portion and the back surface of the substrate may be appropriately removed by plasma etching.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate cleaning method comprising:
providing a substrate including a low-k layer containing silicon to a substrate support;
etching the low-k layer by a plasma generated from a first gas;
after the etching, separating the substrate from the substrate support; and
removing a reaction product attached to the substrate in the etching by a plasma generated from a second gas,
wherein the second gas includes a first carbon-containing gas represented by $C_xH_yF_z$ (y≥0, x/>¼); and
wherein the second gas further includes a second carbon-containing gas different in composition from the first carbon-containing gas.

2. The substrate cleaning method according to claim 1, wherein the second carbon-containing gas is $CO_2$ gas.

3. The substrate cleaning method according to claim 1, wherein a flow rate ratio of the first carbon-containing gas with respect to the second carbon-containing gas in the second gas is 1% or less.

4. The substrate cleaning method according to claim 1, wherein a separation distance between the substrate and the substrate support in the removing the reaction product is within a range of 2.0 mm or more and 4.0 mm or less.

5. The substrate cleaning method according to claim 1, wherein an internal pressure of a processing container in the removing the reaction product is set to be higher than at least an internal pressure of the processing container in the etching the low-k layer.

6. The substrate cleaning method according to claim 5, wherein the internal pressure of the processing container in the removing the reaction product is at least 300 m Torr.

7. The substrate cleaning method according to claim 1, wherein the substrate to be processed includes a central region and an annular peripheral region surrounding the central region in a plane, and
in the removing the reaction product, the second gas is supplied only toward the peripheral region.

8. A plasma processing apparatus comprising:
a processing container;
a substrate support in the processing container;
an actuator configured to raise and lower a substrate with respect to the substrate support;
a gas supply configured to supply a gas into the processing container;
a radio-frequency power supply connected to the substrate support; and
a controller,
wherein the controller is configured to control sequentially executing a process including:
providing a substrate including a low-k layer containing silicon to the substrate support;
etching the low-k layer by plasma generated from a first gas;
after the etching, separating the substrate from the substrate support; and
removing a reaction product attached to the substrate in the etching by a plasma generated from a second gas including at least a first carbon-containing gas represented by $C_xH_yF_z$ (y≥0, x/z>¼); and
wherein the controller is configured to control the gas supply such that the second gas further includes a second carbon-containing gas different in composition from the first carbon-containing gas.

9. The plasma processing apparatus according to claim 8, wherein the controller is configured to control a flow rate ratio of the first carbon-containing gas with respect to the second carbon-containing gas in the second gas to 1% or less.

10. The plasma processing apparatus according to claim 8, wherein the controller is configured to control the actuator such that a separation distance between the substrate and the substrate support when removing the reaction product is within a range of 2.0 mm or more and 4.0 mm or less.

11. The plasma processing apparatus according to claim 8, wherein the gas supply includes:
a first supply configured to supply the first gas to a central region of a substrate to be processed;
a second supply configured to supply the first gas to an annular peripheral region surrounding the central region; and
a third supply configured to supply the second gas to the annular peripheral region.

12. The plasma processing apparatus according to claim 8, wherein the second carbon-containing gas is $CO_2$ gas.

* * * * *